(12) United States Patent
Chang

(10) Patent No.: US 11,303,117 B2
(45) Date of Patent: Apr. 12, 2022

(54) APPARATUS OF PREVENTING ESD AND EMP USING SEMICONDUCTOR HAVING A WIDER BAND GAP AND METHOD THEREOF

(71) Applicant: Liann-Be Chang, Taoyuan (TW)

(72) Inventor: Liann-Be Chang, Taoyuan (TW)

(73) Assignee: Chang Gung University, Taoyuan (TW)

( * ) Notice: Subject to any disclaimer, the term of this patent is extended or adjusted under 35 U.S.C. 154(b) by 0 days.

(21) Appl. No.: 16/931,661

(22) Filed: Jul. 17, 2020

(65) Prior Publication Data
US 2021/0036511 A1  Feb. 4, 2021

(30) Foreign Application Priority Data

Jul. 30, 2019 (TW) .................................. 108126868

(51) Int. Cl.
*H02H 9/04* (2006.01)
*H03K 21/02* (2006.01)

(52) U.S. Cl.
CPC ............. *H02H 9/046* (2013.01); *H03K 21/02* (2013.01)

(58) Field of Classification Search
CPC ...... H02H 9/046; H03K 21/02; H03K 19/003; H01L 27/0255
USPC .......................................................... 361/56
See application file for complete search history.

(56) References Cited

U.S. PATENT DOCUMENTS

| | | | | |
|---|---|---|---|---|
| 6,671,146 B1* | 12/2003 | Hashimoto | ......... | H01L 27/0255 361/56 |
| 2005/0173692 A1* | 8/2005 | Park | .................... | H01L 33/0093 257/13 |
| 2008/0151447 A1* | 6/2008 | Czarnecki | .......... | G11B 33/1493 361/56 |
| 2009/0021873 A1* | 1/2009 | Spode | ................. | H01L 27/0255 361/56 |
| 2012/0286683 A1* | 11/2012 | Radermacher | ......... | H05B 45/37 315/201 |
| 2013/0248917 A1* | 9/2013 | Obata | ..................... | H01L 33/38 257/99 |
| 2020/0028356 A1* | 1/2020 | Bultitude | ................ | H02H 9/046 |
| 2020/0227914 A1* | 7/2020 | Salcedo | .............. | H01L 29/0834 |
| 2020/0286883 A1* | 9/2020 | Simonnet | ................ | H01L 29/04 |

* cited by examiner

*Primary Examiner* — Dharti H Patel

(57) ABSTRACT

An apparatus of preventing ESD and EMP coupled between a signal input and a signal output is provided with a first diode of forward bias including a positive terminal and a negative terminal connected to the signal input and ground respectively; and a first diode of reverse bias including a negative terminal and a positive terminal connected to the signal input and the ground respectively. The semiconductor is a diode including a p-type semiconductor region made of semiconductor material having a predetermined band gap and an n-type semiconductor region made of semiconductor material having a predetermined band gap. The predetermined band gap is greater than 3 eV. The diode operates in forward bias to discharge current generated by ESD and/or EMP. A method of preventing ESD and EMP is also provided.

7 Claims, 6 Drawing Sheets

APPARATUS OF PREVENTING ESD AND EMP USING SEMICONDUCTOR HAVING A WIDER BAND GAP AND METHOD THEREOF

BACKGROUND OF THE INVENTION

1. Field of the Invention

The invention relates to electrostatic discharge (ESD) and more particularly to an apparatus of preventing ESD and EMP using a semiconductor (e.g., diode) having a wider band gap and a method thereof.

2. Description of Related Art

It is known in the art that a filter circuit is a device for filtering out noise of a circuit. A circuit diagram of a conventional low pass filter circuit is shown in FIG. 1. One end of the low pass filter circuit is coupled between a signal input In and a signal output Out and consists of a capacitance C and a resistance R, i.e., RC filter circuit. For an integrated circuit (IC) (i.e., chip), the signal input In is a pin and the signal output Out is a signal input of a first circuit of the chip. The RC filter circuit is used to filter out small signals and is not capable of filtering out signal surges including human body discharge, machine discharge, charger discharge, lightning, atmospheric discharge and electromagnetic pulse (EMP). It is typical to provide a discharge device (e.g., over voltage protection (OVP) device) at a signal input of a circuit or chip.

A circuit diagram of an OVP device 1a is shown in FIG. 2. The OVP device 1a consists of two Zener diodes connected in series and coupled between a signal input In and a load $R_L$. In response to voltage generated by ESD or EMP being greater than a set reverse voltage (i.e., reverse breakdown voltage) of the Zener diode, Zener breakdown occurs at the Zener diodes. Zener diodes have a sharp, highly doped p-n junction with a low Zener voltage, in which case the reverse conduction occurs due to electron quantum tunneling in the short space between p and n regions known as the Zener effect. The ratio of intrinsic semiconductor to extrinsic semiconductor is $10^5$ to 1. When the Zener breakdown occurs, a strong electric field is generated at the junction of a highly-doped diffusion region and the strong electric field attracts many electrons in a conduction band of a n-type region to pass through a depletion layer prior to entering a valence band of a p-type region to join holes. Thus, a significant current is generated by Zener diode.

The OVP device in FIG. 2 is also called transient-voltage-suppression (TVS) diode. Current is generated when a TVS diode is conducted. The conducted current may repeatedly vibrate a load $R_L$. Time versus conducted current for a TVS diode is plotted in FIG. 3. The conduction ends when the excessively high voltage at the load $R_L$ is decreased by releasing heat. Currently, time for decreasing the voltage is very short. Thus, TVS diodes are widely used as ESD protection devices in a circuit or chip to protect electronics from voltage spikes induced on connected wires. In other applications, an EMP simulator consisting of a TVS diode and a gas discharge tube is devised. EMP current is very large and is increased greatly in a very short period of time. Thus, a TVS diode may bring out a protection effect to a front end of EMP waves. Further, EMP current is drained by the gas discharge tube.

But operation frequency of the chips increases greatly and chip size becomes smaller as the Internet of things (IoT), the big data, the cloud and the 5G networks are available. And in turn, less amount of ESD current of EMP current is allowed. For T1 carrier, it has a bit rate of 1.544 million bits per second (Mbps) in Taiwan and North America. As the network communication technologies advance, T2 carrier has a bit rate of 6.1 Mbps, and T3 carrier has a bit rate of 45 Mbps. Currently, for the Synchronous Transport Module (STM-4), as a SDH ITU-T fiber optic network transmission standard, it has a bit rate of 622.080 Mbps. Of course, there is a discharge device or other electronic component at the signal input. For example, an IC having a type of PJSRV05-4 is manufactured in a semiconductor manufacturing process and is used to prevent ESD or EMP at the signal input.

A schematic circuit diagram of a chip of a conventional discharge circuit is shown in FIG. 4. The discharge circuit includes four diodes and a Zener diode which may experience avalanche breakdown at a specified reverse bias voltage (e.g., 90V). The chip may be damaged when ESD or EMP having a voltage greater than 90V is applied to the chip. This is particularly true for high voltage EMP.

Specifically, peak voltage and pulse width of spike noise of ESD are 1 KV and 50 ns respectively. Peak voltage of spike noise of EMP is much higher, e.g., 8-10 KV and pulse width thereof is much wider, e.g., 500-1000 ns. It is understood that TVS diodes manufactured from the typical silicon-based semiconductor cannot withstand the spike noise of EMP. When the spike noise of EMP having a peak voltage of 600V and a pulse width of 500-1000 ns enters a TVS diode via a signal input of a chip, the TVS diode is damaged. After EFT test of IEC61000-4-4 has been conducted, test results show that TVS diodes manufactured from the typical silicon-based semiconductor can withstand a spike current of 40 ampere and a pulse width of 50 ns.

In view of the above description, it is understood that the typical ESD protection devices or circuits do not have the capability of withstand high voltage and/or high current generated due to spike noise of the discharged EMP.

Thus, the need for improvement of ESD protection devices or circuits still exists.

SUMMARY OF THE INVENTION

It is therefore one object of the invention to provide a method of preventing ESD and EMP using a semiconductor wherein the semiconductor is a diode including a p-type semiconductor region made of semiconductor material having a predetermined band gap and an n-type semiconductor region made of semiconductor material having a predetermined band gap; wherein the predetermined band gap is greater than 3 eV; and wherein the diode is configured to operate in forward bias to discharge current generated by ESD and/or EMP.

Preferably, the semiconductor material is $TiO_2$, $SnO_2$, $ZrO_2$, ZnO, ZnS, SiC, GaN, AlN, BN, or $Ga_2O_3$.

Preferably, the diode operating in forward bias is configured to convert current generated by ESD and/or EMP into light.

Preferably, the diode is incorporated into one of an ESD protection circuit, an EMP protection circuit, and the ESD protection circuit and the EMP protection circuit.

It is another object of the invention to provide an apparatus of preventing ESD and EMP coupled between a signal input and a signal output, comprising a first diode of forward bias including a positive terminal and a negative terminal connected to the signal input and ground respectively; and a first diode of reverse bias including a negative terminal and a positive terminal connected to the signal input and the ground respectively; wherein each of the first diode of forward bias and the first diode of reverse bias includes a p-type semiconductor region made of semiconductor material having a predetermined band gap and an n-type semiconductor region made of semiconductor material having a predetermined band gap; wherein the predetermined band gap is greater than 3 eV; and wherein the diode is configured to operate in forward bias to discharge current generated by ESD and/or EMP.

Preferably, the signal input is a pin in an IC and the signal output is a signal input of a first class circuit in the IC in which the first diode of forward bias or the first diode of reverse bias operating in forward bias is configured to convert current generated by ESD and/or EMP into light.

Preferably, a second diode of forward bias is connected either in series with or in parallel to the first diode of forward and a third diode of forward bias is connected either in series with or in parallel to the second diode of forward.

Preferably, a second diode of reverse bias is connected either in series with or in parallel to the first diode of reverse and a third diode of reverse bias is connected either in series with or in parallel to the second diode of reverse.

Preferably, the apparatus is incorporated into a light coupler.

Preferably, a counter is connected to the apparatus so that the counter is configured to count the number of ESD and/or EMP occurrences by receiving a signal from the light coupler.

Preferably, at least one light receiver is connected for receiving light emitted by the apparatus, converting the received light into a light sensing signal, and outputting the light sensing signal.

Preferably, a counter is connected to the light receiver so that the counter is configured to count the number of ESD and/or EMP occurrences by receiving light sensing signal from the light receiver.

The above and other objects, features and advantages of the invention will become apparent from the following detailed description taken with the accompanying drawings.

DETAILED DESCRIPTION OF THE INVENTION

Figure 1:
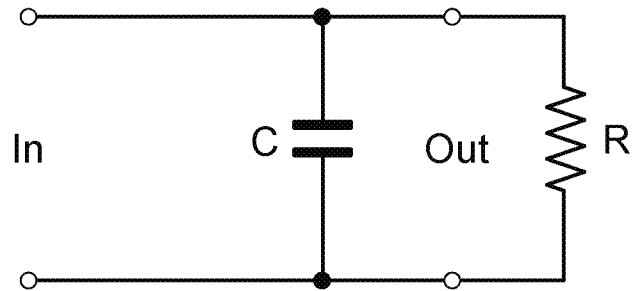
FIG. 1 is a circuit diagram of a conventional low pass filter circuit.
Figure 2:
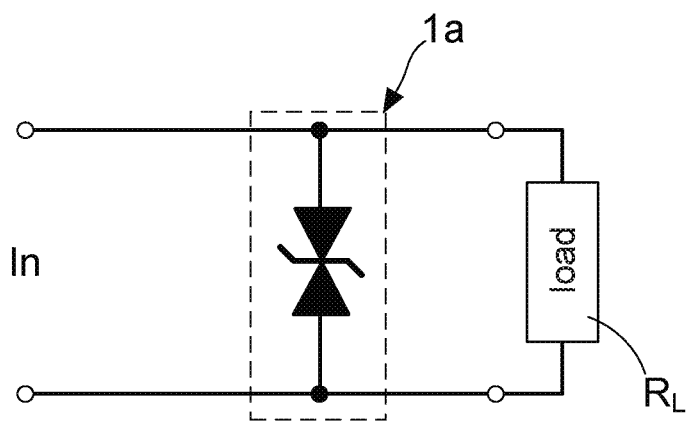
FIG. 2 is a circuit diagram of a conventional voltage protection device.
Figure 3:
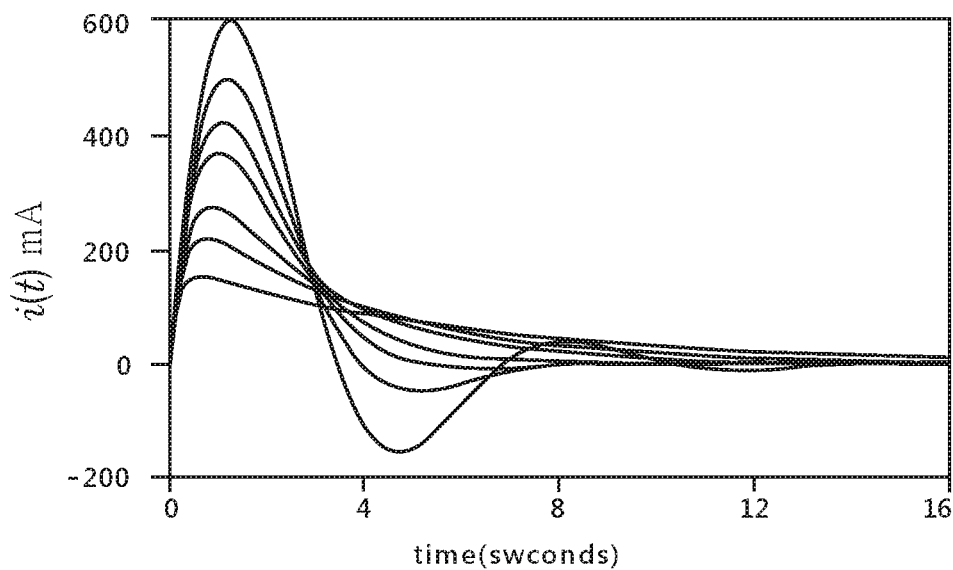
FIG. 3 plots time versus conducted current for a TVS diode.
Figure 4:
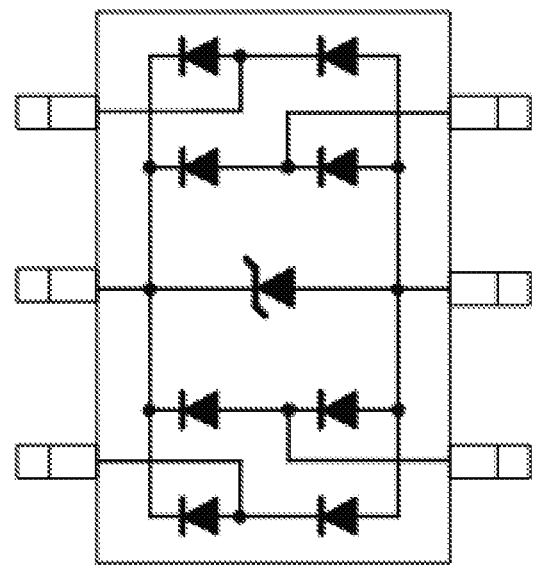
FIG. 4 shows a schematic circuit diagram of a chip of a conventional discharge circuit.
Figure 5:
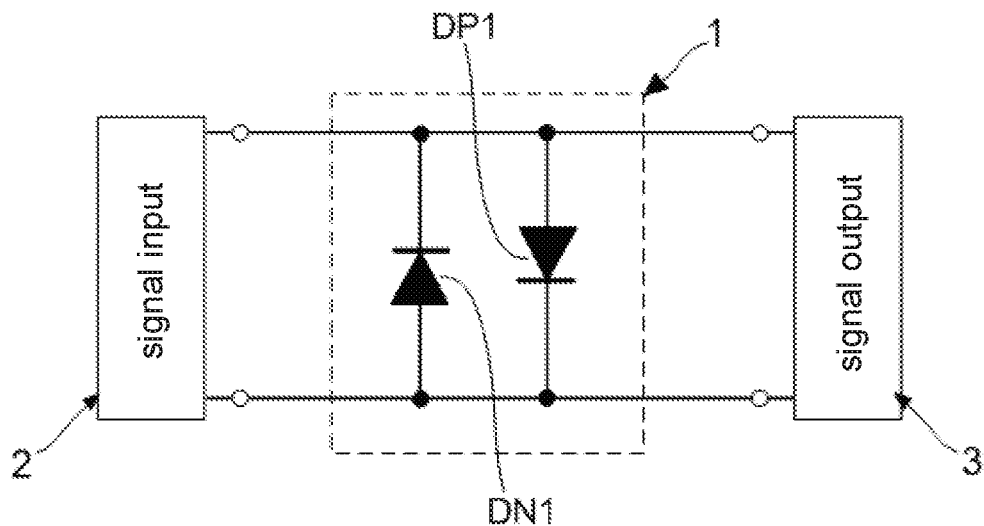
FIG. 5 is a circuit diagram of an apparatus of preventing ESD and EMP according to a first preferred embodiment of the invention.

Referring to FIG. 5, a circuit diagram of an apparatus 1 of preventing ESD and EMP in accordance with a first preferred embodiment of the invention is shown. The apparatus 1 is coupled between a signal input 2 and a signal output 3. It is noted that for an IC (i.e., chip) the signal input 2 is a pin and the signal output 3 is a signal input of a first class circuit in the chip.

The apparatus 1 of preventing ESD and EMP includes a first diode DP1 of forward bias and a first diode DN1 of reverse bias. Positive terminal and negative terminal of the first diode DP1 of forward bias are connected to the signal input 2 and ground respectively. Negative terminal and positive terminal of the first diode DN1 of reverse bias are connected to the signal input 2 and the ground respectively.

Figure 6:
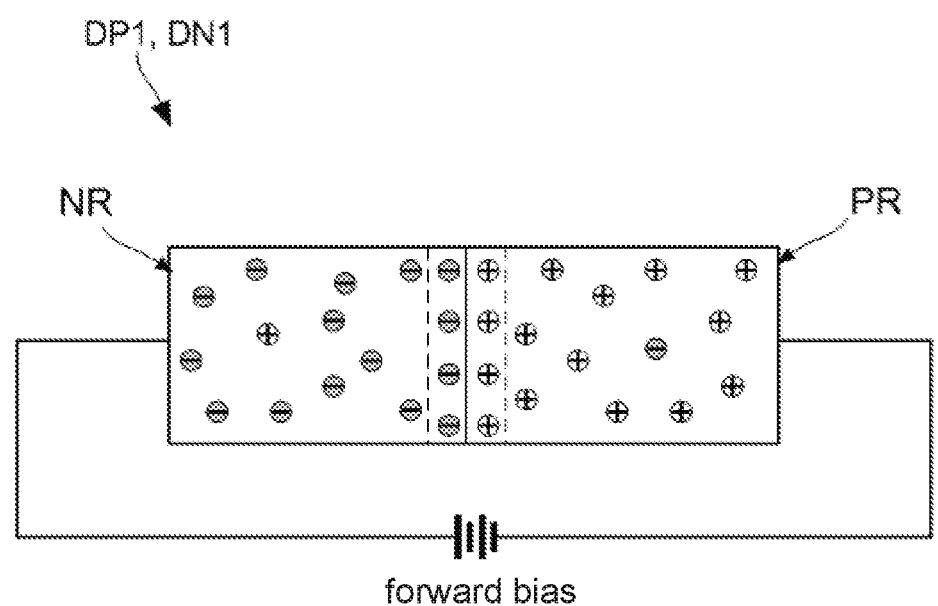
FIG. 6 schematically shows a diode of forward bias (or reverse bias)

Referring to FIG. 6, it schematically shows a diode of forward bias (or reverse bias). As shown in FIGS. 5 and 6, each of the first diode DP1 of forward bias and the first diode DN1 of reverse bias includes a p-type semiconductor region PR made of semiconductor material having a wider band gap and an n-type semiconductor region NR made of semiconductor material having a wider band gap. The semiconductor material has the band gap greater than 3 eV. Types of the semiconductor materials and examples thereof and band gaps of the examples are shown in Table 1 below.

TABLE 1

| types | examples and band gaps thereof |
|---|---|
| Oxide based semiconductor materials | $TiO_2$ (3.2 eV), $SnO_2$ (3.8 eV), $ZrO_2$ (3.6-4.7 eV), ZnO(3.37 eV) |
| Sulfide based semiconductor materials | ZnS (3.54 eV) |
| Nitride based semiconductor materials | GaN (3.28 eV), AlN (6.2 eV), h-BN (5.9 eV) |
| Gallium compound based semiconductor materials | GaP (2.24 eV), GaAs (1.42 eV) |
| Silicon compound based semiconductor materials | 4H-SiC(3.23 eV), 6H($\alpha$)-SiC(3.05 eV) |

As shown in FIGS. 5 and 6, regarding the protection of both ESD and EMP, each of the first diode DP1 of forward bias and the first diode DN1 of reverse bias operates in forward bias to discharge ESD current conducted by ESD and/or EMP current conducted by EMP. It is known that a conduction voltage of a diode having a wider band gap is greater than 3V. Thus, the first diode DP1 of forward bias and the first diode DN1 of reverse bias are connected in parallel. Either surge current from the signal input 2 in a forward direction or surge current from the signal input 2 in a reverse direction will be directed to ground for discharge via the first diode DP1 of forward bias or the first diode DN1 of reverse bias.

Unlike the conventional TVS diode (e.g., Zener diode) utilizing Zener breakdown as ESD or EMP protection, the diode having a wider band gap of the invention uses forward bias as a special ESD and/or EMP protection. The diode having a wider band gap is not liable to avalanche breakdown and thus avalanche breakdown does not occur when the diode operates in forward bias. Thus, the apparatus 1 of preventing ESD and EMP including the first diode DP1 of forward bias and the first diode DN1 of reverse bias connected in parallel but opposite directions can withstand a very large ESD current and/or EMP current. It is envisaged by the invention that the apparatus 1 of preventing ESD and EMP can replace the conventional TVS device formed of silicon based semiconductor as ESD and/or EMP preventing device.

Figure 7A:
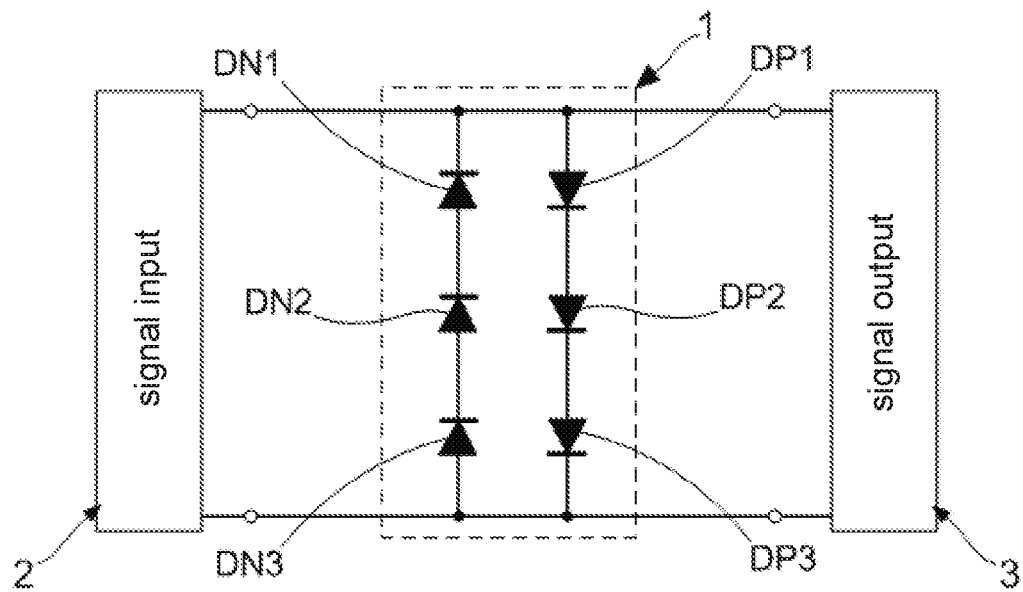
FIG. 7A is a first circuit diagram of an apparatus of preventing ESD and EMP according to a second preferred embodiment of the invention.
Figure 7B:
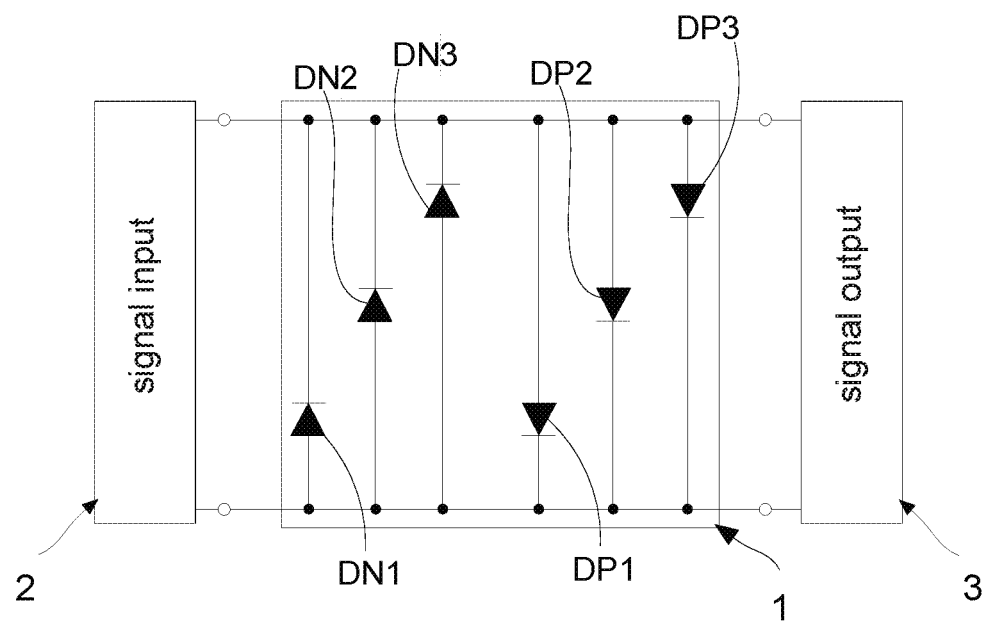
FIG. 7B is a second circuit diagram of the apparatus in FIG. 7A.

Referring to FIGS. 7A and 7B, first and second circuit diagrams of an apparatus 1 of preventing ESD and EMP according to a second preferred embodiment of the invention is shown. The characteristics of the second preferred embodiment are substantially the same as that of the first preferred embodiment except the following: there are further provided a second diode DP2 of forward bias, a third diode DP3 of forward bias, a second diode DN2 of reverse bias, and a third diode DN3 of reverse bias in which the first diode DP1 of forward bias, the second diode DP2 of forward bias, and the third diode DP3 of forward bias are connected in series (FIG. 7A) or in parallel (FIG. 7B); and the first diode DN1 of reverse bias, the second diode DN2 of reverse bias, and the third diode DN3 of reverse bias are connected in series (FIG. 7A) or in parallel (FIG. 7B). The series or parallel connection is implemented depending on voltage or current.

A diode having a desired band gap diode can be manufactured by a semiconductor material selected from Table 1. Since the selected semiconductor material has a desired (i.e., wider) band gap, it is possible of setting the diode to conduct at a predetermined voltage (e.g., 3v). Further, for a circuit having the signal input 2 and the signal output 3 or a chip operating at a voltage greater than 3v, the circuit in FIG. 7A or FIG. 7B can be used in which a protection circuit includes three diodes DP1, DP2 and DP3 of forward bias connected in series and three diodes DN1, DN2 and DN3 of reverse bias connected in series but opposite directions. In comparison with the circuit in FIG. 5, the circuits in FIGS. 7A and 7B are advantageous because the parasite capacitance of the apparatus 1 of preventing ESD and EMP decreases as the number of the diodes connected in series increases, and the operating frequency also increases. Therefore, the apparatus 1 of preventing ESD and EMP has applications in high frequency circuits.

Figure 8:
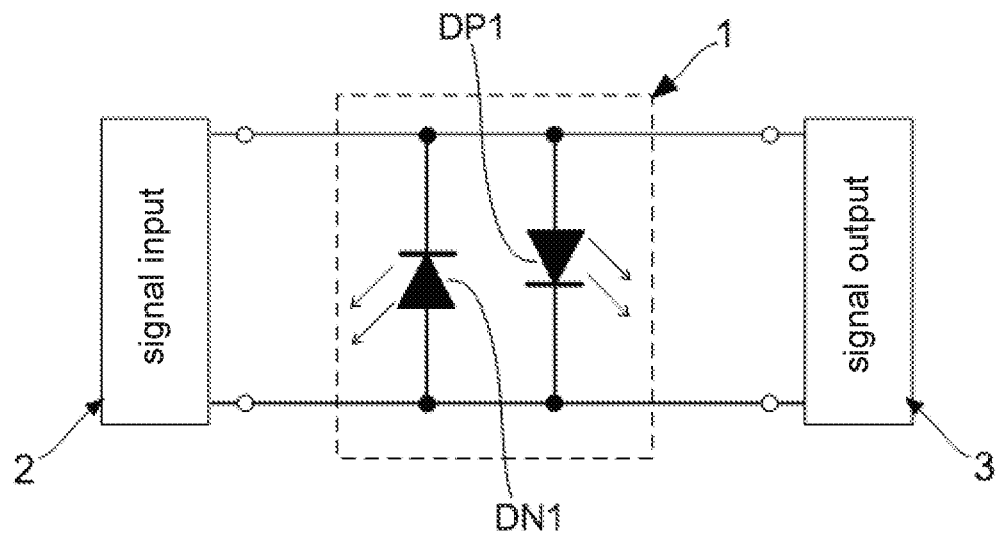
FIG. 8 is a circuit diagram of an apparatus of preventing ESD and EMP according to a third preferred embodiment of the invention.

Referring to FIG. 8, a circuit diagram of an apparatus 1 of preventing ESD and EMP according to a third preferred embodiment of the invention is shown. The characteristics of the third preferred embodiment are substantially the same as that of the first preferred embodiment except the following: both the diode DP1 of forward bias and the diode DN1 of reverse bias are replaced by light-emitting diodes (LEDs).

The LEDs are formed of direct band gap semiconductor material. When external current spikes of forward bias or current spikes of reverse bias enters the circuit, either the diode (i.e., LED) DP1 of forward bias conducts or the diode (i.e., LED) DN1 of reverse bias conducts. As a result, the circuit operates. The current spikes are discharged to ground and either the diode DP1 of forward bias conducts or the diode DN1 of reverse bias converts electrical energy of ESD or EMP into light. The embodiment aims to quickly consume excessive energy by emitting light so that energy of the input current spikes can be quickly decreased.

Figure 9:
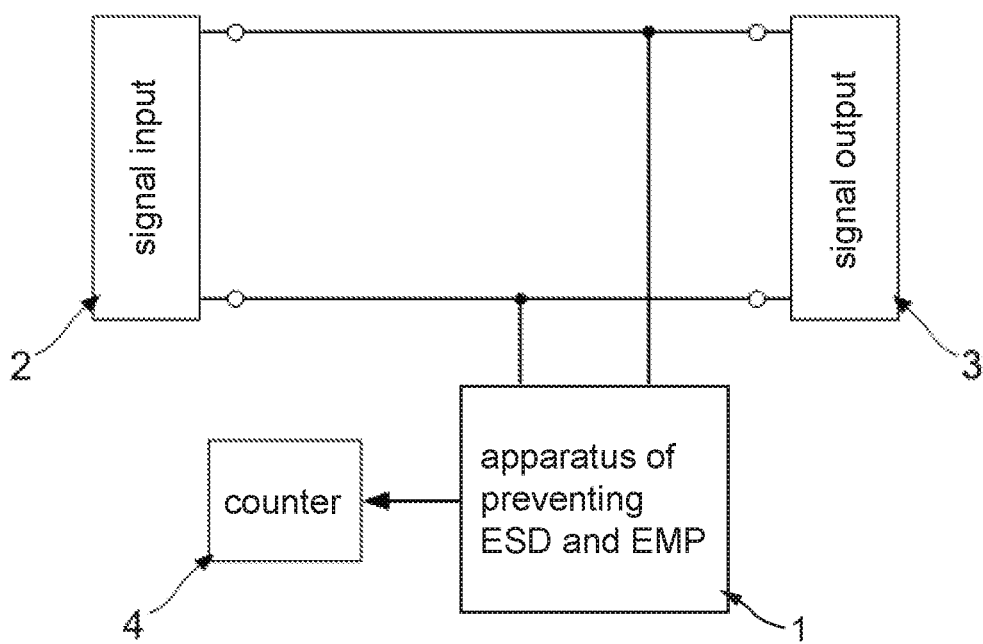
FIG. 9 is a circuit diagram of an apparatus of preventing ESD and EMP according to a fourth preferred embodiment of the invention.

Referring to FIG. 9, a circuit diagram of an apparatus 1 of preventing ESD and EMP according to a fourth preferred embodiment of the invention is shown. The characteristics of the fourth preferred embodiment are substantially the same as that of the first preferred embodiment except the following: a counter 4 is provided. The apparatus 1 of preventing ESD and EMP is incorporated into a light coupler or implemented as a device similar to the light coupler. The counter 4 is connected to the apparatus 1 of preventing ESD and EMP (i.e., the light coupler) so that the counter 4 can count the number of ESD and/or EMP occurrences by receiving a signal from the light coupler.

Figure 10:
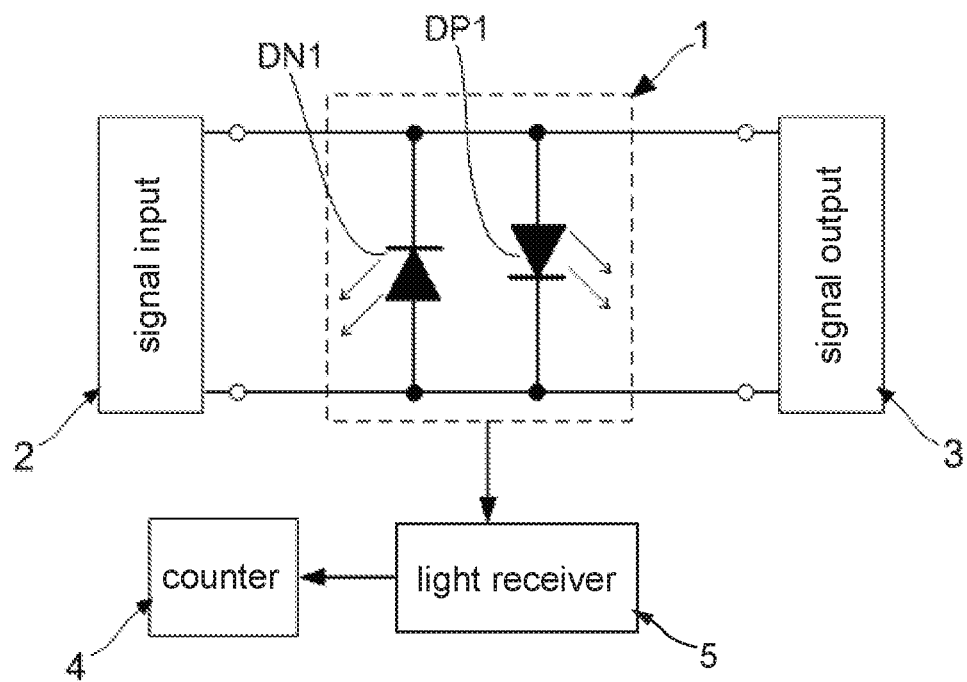
FIG. 10 is a circuit diagram of an apparatus of preventing ESD and EMP according to a fifth preferred embodiment of the invention.

Referring to FIG. 10, a circuit diagram of an apparatus 1 of preventing ESD and EMP according to a fifth preferred embodiment of the invention is shown. The characteristics of the fifth preferred embodiment are substantially the same as that of the third preferred embodiment except the following: there is further provided a light receiver 5 interconnecting a counter 4 and the apparatus 1 of preventing ESD and EMP. In detail, the light receiver 5 receives light emitted by the apparatus 1 of preventing ESD and EMP. Thus, the counter 4 can count the number of ESD and/or EMP occurrences by receiving a signal from the light receiver 5.

While the invention has been described in terms of preferred embodiments, those skilled in the art will recognize that the invention can be practiced with modifications within the spirit and scope of the appended claims.

What is claimed is:

1. A method of preventing electrostatic discharge (ESD) and electromagnetic pulse (EMP) comprising:
    using a semiconductor coupled between a signal input and a signal output,
    wherein the semiconductor is a diode consisting of a p-type semiconductor region made of semiconductor material having a predetermined band gap and an n-type semiconductor region made of semiconductor material having a predetermined band gap,
    wherein the predetermined band gap is greater than 3 eV, and
    wherein the diode is configured to operate in forward bias to discharge current generated by ESD and/or EMP.

2. The method of claim 1, wherein the semiconductor material is $TiO_2$, $SnO_2$, $ZrO_2$, ZnO, ZnS, SiC, GaN, AlN, BN, or $Ga_2O_3$.

3. The method of claim 1, wherein the diode is incorporated into one of an ESD protection circuit, an EMP protection circuit, and the ESD protection circuit and the EMP protection circuit.

4. An apparatus for preventing ESD and EMP coupled between a signal input and a signal output, comprising:
    a first diode of forward bias including a positive terminal and a negative terminal connected to the signal input and ground respectively; and
    a first diode of reverse bias including a negative terminal and a positive terminal connected to the signal input and the ground respectively,
    wherein each of the first diode of forward bias and the first diode of reverse bias consists of a p-type semiconductor region made of semiconductor material having a predetermined band gap and an n-type semiconductor region made of semiconductor material having a predetermined band gap,
    wherein the predetermined band gap is greater than 3 eV, and
    wherein the diode is configured to operate in forward bias to discharge current generated by ESD and/or EMP.

5. The apparatus of claim 4, wherein the signal input is a pin in an IC and the signal output is a signal input of a first class circuit in the IC.

6. The apparatus of claim 4, wherein the semiconductor material is $TiO_2$, $SnO_2$, $ZrO_2$, ZnO, ZnS, SiC, GaN, AlN, BN, or $Ga_2O_3$.

7. An apparatus for preventing ESD and EMP coupled between a signal input and a signal output, comprising:

a first diode of forward bias including a positive terminal and a negative terminal connected to the signal input and ground respectively;
a second diode of forward bias connected either in series with or in parallel to the first diode of forward bias;
a third diode of forward bias connected either in series with or in parallel to the second diode of forward bias; and
a first diode of reverse bias including a negative terminal and a positive terminal connected to the signal input and the ground respectively;
a second diode of reverse bias connected either in series with or in parallel to the first diode of reverse bias;
a third diode of reverse bias connected either in series with or in parallel to the second diode of reverse bias; and
wherein each of the first, second and third diodes of forward bias and the first, second and third diodes of reverse bias consists of a p-type semiconductor region made of semiconductor material having a predetermined band gap and an n-type semiconductor region made of semiconductor material having a predetermined band gap;
wherein the predetermined band gap is greater than 3 eV; and
wherein each of the first, second and third diodes is configured to operate in forward bias to discharge current generated by ESD and/or EMP.

\* \* \* \* \*